United States Patent
Onishi et al.

(10) Patent No.: US 9,486,892 B2
(45) Date of Patent: Nov. 8, 2016

(54) POLISHING COMPOSITION

(71) Applicant: FUJIMI INCORPORATED, Kiyosu-shi, Aichi (JP)

(72) Inventors: Shogo Onishi, Kiyosu (JP); Yasuto Ishida, Kiyosu (JP); Tatsuhiko Hirano, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 14/440,208

(22) PCT Filed: Oct. 29, 2013

(86) PCT No.: PCT/JP2013/079267
§ 371 (c)(1),
(2) Date: May 1, 2015

(87) PCT Pub. No.: WO2014/069457
PCT Pub. Date: May 8, 2014

(65) Prior Publication Data
US 2015/0344738 A1    Dec. 3, 2015

(30) Foreign Application Priority Data

Nov. 2, 2012  (JP) ................. 2012-243126

(51) Int. Cl.
| | |
|---|---|
| *B24B 37/04* | (2012.01) |
| *C09G 1/02* | (2006.01) |
| *H01L 21/321* | (2006.01) |
| *C09K 3/14* | (2006.01) |

(52) U.S. Cl.
CPC .............. *B24B 37/044* (2013.01); *C09G 1/02* (2013.01); *C09K 3/1445* (2013.01); *C09K 3/1463* (2013.01); *H01L 21/3212* (2013.01)

(58) Field of Classification Search
CPC ............................. C09G 1/02; H01L 21/3212
See application file for complete search history.

(56) References Cited

U.S. PATENT DOCUMENTS

| | | | |
|---|---|---|---|
| 4,944,836 A | 7/1990 | Beyer et al. | |
| 5,770,095 A | 6/1998 | Sasaki et al. | |
| 7,459,398 B2 | 12/2008 | Minamihaba et al. | |
| 8,080,476 B2 | 12/2011 | Kawamura et al. | |
| 2004/0043702 A1* | 3/2004 | Singh ................. | C09G 1/02 451/36 |
| 2004/0077295 A1* | 4/2004 | Hellring ............... | C09G 1/02 451/41 |
| 2006/0030503 A1 | 2/2006 | Minamihaba et al. | |
| 2008/0032505 A1 | 2/2008 | Kawamura et al. | |

(Continued)

FOREIGN PATENT DOCUMENTS

| | | |
|---|---|---|
| JP | 62-102543 A | 5/1987 |
| JP | 08-083780 A | 3/1996 |
| JP | 2006-049709 A | 2/2006 |

(Continued)

*Primary Examiner* — Duy Deo
(74) *Attorney, Agent, or Firm* — Foley & Lardner LLP

(57) ABSTRACT

[Problem] Provided is a polishing composition which is suitable for polishing a polishing object having a metal wiring layer and capable of diminishing the step defect while maintaining a high polishing rate.
[Solution] Provided is a polishing composition used in polishing a polishing object having a metal wiring layer, which contains a metal corrosion inhibitor, a complexing agent, a surfactant, and water and in which the solid surface energy of the polishing object surface after polishing the polishing object using the polishing composition is 30 mN/m or less, and the surfactant is preferably an anionic surfactant.

5 Claims, 1 Drawing Sheet

(56) References Cited

U.S. PATENT DOCUMENTS

2009/0087988 A1\* 4/2009 Saie .................. C09G 1/02
  438/693
2009/0311864 A1\* 12/2009 Yamada ............... C09G 1/02
  438/693

FOREIGN PATENT DOCUMENTS

| JP | 2008-041782 A | 2/2008 |
| JP | 2011-171446 A | 9/2011 |
| WO | WO 2010/098278 A1 | 9/2010 |

\* cited by examiner (a)
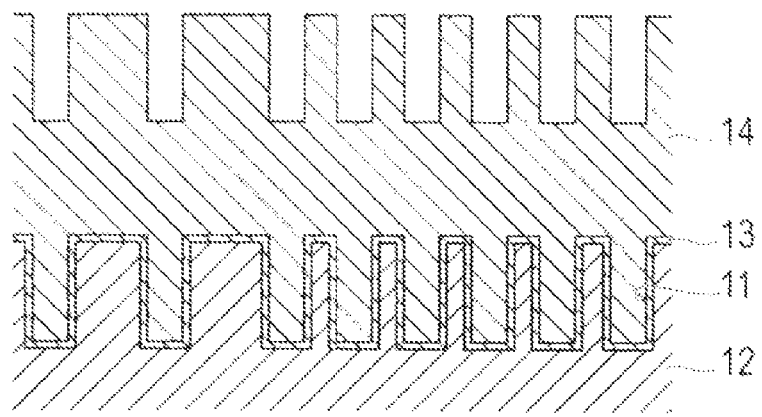
(b)
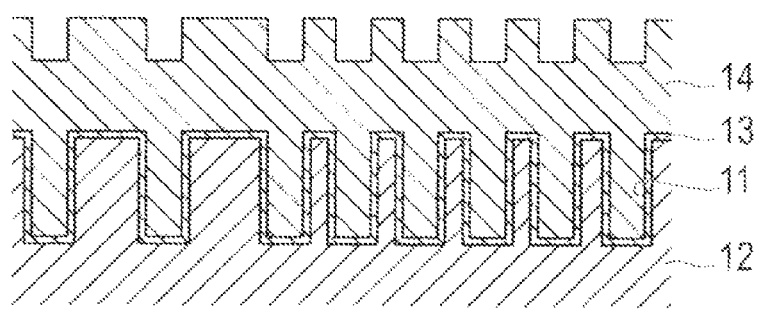
(c)
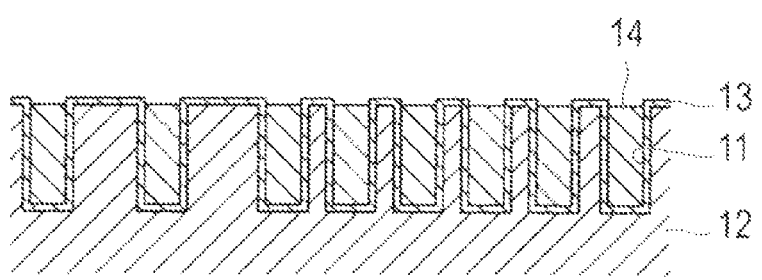
(d)
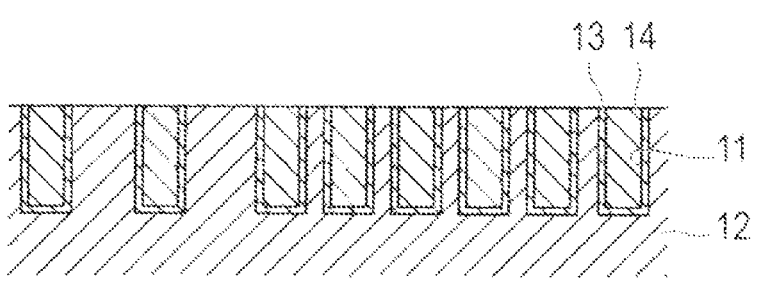

POLISHING COMPOSITION

TECHNICAL FIELD

The present invention relates to a polishing composition. In addition, the invention relates to a polishing method using the polishing composition and a method for producing a substrate.

BACKGROUND ART

The invention relates to a composition for polishing the surface of a polishing object containing a metal, for example, in a semiconductor integrated circuit (hereinafter referred to as the "LSI").

New fine processing techniques have been developed as the LSI in highly integrated and increased in speed. The chemical mechanical polishing (hereinafter, referred to as the "CMP") method is also one of them and is a technique that is applied in the LSI manufacturing process, especially for the flattening of the interlayer insulating membrane in the multilayer wiring forming process, the formation of contact plug and the formation of embedded wiring. This technique is disclosed, for example, in Patent Literature 1.

In the formation of contact plug, tungsten is used as the embedded material and the material for the mutual diffusion barrier thereof. In the formation of contact plug, a manufacturing method to remove the excess part other than the contact plug by CMP is used. In addition, in the formation of embedded wiring, the utilization of copper or a copper alloy as a metal wiring serving as the wiring material has recently been attempted in order to enhance the performance of LSI. For copper or a copper alloy, the so-called damascene method in which a thin membrane of copper or a copper alloy is deposited on the insulation membrane having a groove formed in advance and embedded and the thin membrane other than the groove portion is removed by CMP to form the embedded wiring is mainly employed since it is difficult to perform the fine processing by the dry etching method which has been frequently used in the formation of aluminum alloy wiring of the related art. It is general that the polishing composition for metal used in CMP contains a polishing accelerator such as an acid and an oxidant and further contains abrasive grains if necessary. In addition, it has also been proposed to use a polishing composition further containing a metal corrosion inhibitor in order to improve the flatness of the polishing object after polishing. For example, it is disclosed in Patent Literature 2 that a polishing composition containing an amino acetic acid and/or an amidosulfonic acid, an oxidant, benzotriazole and water is utilized. However, there is room for improvement upon the fact that the step such as dishing (a phenomenon in which the metal wiring layer is excessively polished) gets worse although a high polishing rate is achieved in the case of conducting the CMP method using the composition disclosed in Patent Literature 1 or Patent Literature 2. Furthermore, a polishing composition which contains abrasive grains, a specific additive and water and has a surface tension regulated at a certain value or less is disclosed in Patent Literature 3 in order to solve these problems.

CITATION LIST

Patent Literatures

Patent Literature 1: JP 62-102543 A
Patent Literature 2: JP 8-83780 A
Patent Literature 3: JP 2011-171446 A However, in the polishing composition disclosed in Patent Literature 3, it has been revealed that there is room for further improvement upon the problem of the step such as dishing although it seems that the solution has been found out by improving the wettability (affinity) or homogeneity of the polishing composition for the polishing object through a decrease in the surface tension of the polishing composition itself.

Accordingly, an object of the invention is to provide a means capable of realizing a diminished step defect such as dishing while maintaining a high polishing rate in a polishing composition used in application to polish a polishing object having a metal wiring layer.

The present inventors have conducted intensive investigations to solve the above problem. As a result, it has been found out that the above problem can be solved by containing a metal corrosion inhibitor, a complexing agent, a surfactant and water in a polishing composition and regulating the solid surface energy of the polishing object surface after polishing the polishing object using the polishing composition to 30 mN/m or less, whereby the invention has been completed. In particular, the invention has been completed based on a new finding that the above problem can be solved using a hydrophobic function working between the polishing composition and the polishing object unlike the technique to improve the affinity of the polishing composition for the polishing object of the related art disclosed in Patent Literature 3.

In other words, an embodiment of the invention is a polishing composition used in application to polish the polishing object having a metal wiring layer. Moreover, the polishing composition is characterized in that which contains a metal corrosion inhibitor, a complexing agent, a surfactant, and water, and the solid surface energy of the polishing object surface after polishing the polishing object using the polishing composition is 30 mN/m or less.

BRIEF DESCRIPTION OF DRAWINGS

FIGS. 1(a) to 1(d) are cross-sectional schematic views illustrating an example of a polishing object according to the invention, and 11 denotes a trench, 12 denotes an insulating layer, 13 denotes a barrier layer and 14 denotes a metal wiring layer.

DESCRIPTION OF EMBODIMENTS

The invention is a polishing composition used in the application to polish a polishing object including a metal wiring layer, the polishing composition containing a metal corrosion inhibitor, a complexing agent, a surfactant, and water, in which the solid surface energy of the polishing object surface after polishing the polishing object using the polishing composition is 30 mN/m or less. Such a configuration makes it possible to diminish the step defect while maintaining a high polishing rate.

Although the detailed reasons why it is possible to diminish the step defect while maintaining a high polishing rate of the polishing object having a metal wiring layer by the use of the polishing composition of the invention is unknown, the water repellency of the surface of the polishing object during polishing can be maintained through maintaining the solid surface energy of the surface of the polishing object after polishing at a certain value or less. This means that the aqueous polishing composition hardly comes in contact (lower affinity) with the surface of the polishing object during polishing, and as a result, it is easy to control the chemical etching of the polishing object or the mechanical function by abrasive grains to the polishing object.

For example, in the case of increasing the affinity between the polishing composition and the polishing object as in the related art, the step is caused by the excessive chemical etching of a mechanical function by abrasive grains, but it is considered that it is possible to diminish the chemical etching or the mechanical function by abrasive grains by lowering the affinity between the polishing composition and the polishing object on the basis of the invention, and as a result, the step defect such as dishing can be diminished while maintaining a high polishing rate. Incidentally, the above mechanism is a presumption, and thus the invention is not limited to the above mechanism in any way.

[Polishing Object]

First, an example of the polishing object and the semiconductor wiring process according to the invention will be described with reference to FIGS. 1(a) to 1(d). The semiconductor wiring process usually includes the following steps, but the invention is not intended to be limited to the use of the following steps.

As illustrated in FIG. 1a), a barrier layer 13 and a metal wiring layer 14 are sequentially formed on an insulating layer 12 having a trench 11 provided on a substrate (not illustrated). The barrier layer 13 is formed on the insulating layer 12 so as to cover the surface of the insulating layer 12 prior to the formation of the metal wiring layer 14. The thickness of the barrier layer 13 is thinner than the depth and width of the trench 11. The metal wiring layer 14 is formed on the barrier layer 13 so as to fill at least the trench 11 subsequently to the formation of the barrier layer 13.

In a case in which at least the outer portion of the metal wiring layer 14 and the outer portion of the barrier layer 13 are removed by CMP, first, most of the outer portion of the metal wiring layer 14 is removed as illustrated in FIG. 1(b). Next, the rest of the outer portion of the metal wiring layer 14 is removed in order to expose the upper surface of the outer portion of the barrier layer 13 as illustrated in FIG. 1(c).

Thereafter, at least the portion of the metal wiring layer 14 positioned outside the trench 11 (outer portion of the metal wiring layer 14) and the portion of the barrier layer 13 positioned outside the trench 11 (outer portion of the barrier layer 13) are removed by CMP. As a result, at least a part of the portion of the barrier layer 13 positioned inside the trench 11 (inner portion of the barrier layer 13) and at least a part of the portion of the metal wiring layer 14 positioned inside the trench 11 (inner portion of the metal wiring layer 14) are left on the insulating layer 12 as illustrated in FIG. 1(d). In other words, a part of the barrier layer 13 and a part of the metal wiring layer 14 are left on the inside of the trench 11. Consequently, the part of the metal wiring layer 14 left on the inside of the trench 11 functions as wiring.

The polishing composition of the invention is use din polishing a polishing object having a metal wiring layer, preferably, in polishing a polishing object having a metal wiring layer and a barrier layer as described above.

The metal contained in the metal wiring layer is not particularly limited, and examples thereof may include copper, aluminum, hafnium, cobalt, nickel, titanium, tungsten and the like. These metals may be contained in the metal wiring layer in the form of an alloy or a metal compound. The metal wiring layer is preferably copper or a copper alloy. These metals may be used singly or in combination of two or more kinds.

In addition, the metal contained in the barrier layer is not also particularly limited, and examples thereof may include a metal such as titanium and tantalum and a noble metal such as ruthenium, silver, gold, palladium, platinum, rhodium, iridium and osmiom. These metals and noble metals may be contained in the barrier layer in the form of an alloy or a metal compound and may be used singly or in combination of two or more kinds.

Next, the configuration of the polishing composition of the invention will be described in detail.

[Metal Corrosion Inhibitor]

The addition of a metal corrosion inhibitor into the polishing composition makes it possible to further suppress the occurrence of the hollow at the side of the wiring formed by polishing using the polishing composition. In addition, it is possible to further suppress the occurrence of the step defect such as dishing on the surface of the polishing object after being polished using the polishing composition.

The metal corrosion inhibitor usable is not particularly limited but is preferably a heterocyclic compound. The number of members constituting the heterocyclic ring in the heterocyclic compound is not particularly limited. In addition, the heterocyclic compound may be a single ring compound or a polycyclic compound having a condensed ring. The metal corrosion inhibitor may be used singly or as a mixture of two or more kinds. Moreover, the metal corrosion inhibitor used may be a commercially available product or a synthetic product.

Specific examples of the heterocyclic compound usable as the metal corrosion inhibitor may include an nitrogen-containing heterocyclic compound such as a pyrrole compound, a pyrazole compound, an imidazole compound, a triazole compound, a tetrazole compound, a pyridine compound, a pyrazine compound, a pyridazine compound, a pyrindine compound, an indolizine compound, a indole compound, an isoindole compound, an indazole compound, a purine compound, a quinolizine compound, a quinoline compound, an isoquinoline compound, a naphthyridine compound, a phthalazine compound, a quinoxaline compound, a quinazoline compound, a cinnoline compound, a buterizine compound, a thiazole compound, an isothiazole compound, an oxazole compound, an isoxazole compound and a furazan compound.

For more specific examples, examples of the pyrazole compound may include 1H-pyrazole, 4-nitro-3-pyrazole carboxylic acid, 3,5-pyrazole carboxylic acid, 3-amino-5-phenyl pyrazole, 5-amino-3-phenyl-pyrazole, 3,4,5-tribromopyrazole, 3-aminopyrazole, 3,5-dimethylpyrazole, 3,5-dimethyl-1-hydroxymethyl pyrazole, 3-methylpyrazole, 1-methylpyrazole, 3-amino-5-methylpyrazole, 4-aminopyrazolo[3,4]pyrimidine, allopurinol, 4-chloro-1H-pyrazolo[3,4-D]pyrimidine, 3,4-dihydroxy-6-methylpyrazolo(3,4-B)-pyridine, 6-methyl-1H-pyrazolo[3,4-b]pyridin-3-amino and the like.

Examples of the imidazole compound may include imidazole, 1-methylimidazole, 2-methylimidazole, 4-methylimidazole, 1,2-dimethylpyrazole, 2-ethyl-4-methylimidazole, 2-isopropylimidazole, benzimidazole, 5,6-dimethylbenzimidazole, 2-amino-benzimidazole, 2-chlorobenzimidazole, 2-methylbenzimidazole, 2-(1-hydroxyethyl)benzimidazole, 2-hydroxy-benzimidazole, 2-phenylbenzimidazole, 2,5-dimethylbenzimidazole, 5-methylbenzimidazole, 5-nitrobenzimidazole, 1H-purine and the like.

Examples of the triazole compound may include 1,2,3-triazole, 1,2,4-triazole, 1-methyl-1,2,4-triazole, methyl-1H-1,2,4-triazole-3-carboxylate, 1,2,4-triazole-3-carboxylic acid, methyl 1,2,4-triazole-3-carboxylate, 1H-1,2,4-triazole-3-thiol, 3,5-diamino-1H-1,2,4-triazole, 3-amino-1,2,4-triazole-5-thiol, 3-amino-1H-1,2,4-triazole, 3-amino-5-benzyl-4H-1,2,4-triazole, 3-amino-5-methyl-4H-1,2,4-triazole, 3-nitro-1,2,4-triazole, 3-bromo-5-nitro-1,2,4-triazole, 4-(1,2,4-triazole-1-yl)phenol, 4-amino-1,2,4-triazole, 4-amino-3,5-dipropyl-4H-1,2,4-triazole, 4-amino-3,5-dimethyl-4H-1,2,4-triazole, 4-amino-3,5-dipeptyl-4H-1,2,4-triazole, 5-methyl-1,2,4-triazole-3,4-diamine, 1H-benzotriazole, 1-hydroxybenzotriazole, 1-aminobenzotriazole, 1-carboxybenzotriazole, 5-chloro-1H-benzotriazole, 5-nitro-1H-benzotriazole, 5-carboxy-1H-benzotriazole, 5-methyl-1H-benzotriazole, 5,6-1H-benzotriazole, 1-(1',2'-dicarboxyethyl)benzotriazole, 1-[N,N-bis(hydroxyethyl)aminomethyl]benzotriazole, 1-[N,N-bis(hydroxyethyl)aminomethyl]-5-methylbenzotriazole, 1-[N,N-bis(hydroxyethyl)aminomethyl]-4-methylbenzotriazole and the like.

Examples of the tetrazole compound may include such as 1H-tetrazole, 5-methyltetrazole, 5-aminotetrazole and 5-phenyltetrazole.

Examples of the indazole compound may include 1H-indazole, 5-amino-1H-indazole, 5-nitro-1H-indazole, 5-hydroxy-1H-indazole, 6-amino-1H-indazole, 6-nitro-1H-indazole, 6-hydroxy-1H-indazole, 3-carboxy-5-methyl-1H-indazole and the like.

Examples of the indole compound may include 1H-indole, 1-methyl-1H-indole, 2-methyl-1H-indole, 3-methyl-1H-indole, 4-methyl-1H-indole, 5-methyl-1H-indole, 6-methyl-1H-indole, 7-methyl-1H-indole, 4-amino-1H-indole, 5-amino-1H-indole, 6-amino-1H-indole, 7-amino-1H-indole, 4-hydroxy-1H-indole, 5-hydroxy-1H-indole, 6-hydroxy-1H-indole, 7-hydroxy-1H-indole, 4-methoxy-1H-indole, 5-methoxy-1H-indole, 6-methoxy-1H-indole, 7-methoxy-1H-indole, 4-chloro-1H-indole, 5-1H-indole, 6-chloro-1H-indole, 7-chloro-1H-indole, 4-carboxy-1H-indole, 5-carboxy-1H-indole, 6-carboxy-1H-indole, 7-carboxy-1H-indole, 4-nitro-1H-indole, 5-nitro-1H-indole, 6-nitro-1H-indole, 7-nitro-1H-indole, 4-nitrile-1H-indole, 5-nitrile-1H-indole, 6-nitrile-1H-indole, 7-nitrile-1H-indole, 2,5-dimethyl-1H-indole, 1,2-dimethyl-1H-indole, 1,3-dimethyl-1H-indole, 2,3-dimethyl-1H-indole, 5-amino-2,3-dimethyl-1H-indole, 7-ethyl-1H-indole, 5-(aminomethyl)indole, 2)-methyl-5-amino-1H-indole, 3-hydroxymethyl-1H-indole, 6-isopropyl-1H-indole, 5-chloro-2-methyl-1H-indole, and the like.

Among these, a preferred heterocyclic compound is a triazole compound, and particularly, 1H-benzotriazole, 5-methyl-1H-benzotriazole, 5,6-dimethyl-1H-benzotriazole, 1-[N,N-bis(hydroxyethyl)aminomethyl]5-methylbenzotriazole, 1-[bis(hydroxyethyl)aminoethyl]-4-methylbenzotriazole, 1,2,3-triazole, and 1,2,4-triazole are preferable. These heterocyclic compounds exhibit a high chemical or physical adsorption force to the surface of a polishing object and thus it is possible to lower the affinity for the surface of the polishing object and to form a stronger protective membrane. This is advantageous in terms of improving the flatness of the surface of the polishing object after being polished using the polishing composition of the invention.

The lower limit of the content of the metal corrosion inhibitor in the polishing composition is preferably at 0.001% by mass or more, more preferably 0.003% by mass or more and even more preferably 0.005% by mass or more with respect to 100% by mass of the total amount of the composition. In addition, the upper limit of the content of the metal corrosion inhibitor in the polishing composition is preferably 1.0% by mass or less, more preferably 0.5% by mass or less and even more preferably 0.1% by mass or less. In such a range, the step of the polishing object after being polished using the polishing composition is diminished and the polishing rate of the polishing object by the polishing composition is improved.

[Complexing Agent]

There is an advantageous effect to improve the polishing rate of the polishing object by the polishing composition by etching function of the complexing agent when a complexing agent is added to the polishing composition.

As the complexing agent, it is possible to use such as an inorganic acid, an organic acid, an amino acid, a nitrile compound, and a chelating agent, for example. Specific examples of the inorganic acid may include sulfuric acid, nitric acid, boric acid, carbonic acid and the like. Specific examples of the organic acid may include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, no octanoic acid, 2-ethylhexanoic acid, benzoic acid, glycolic acid, salicylic acid, glycerin acid, oxalic acid, malonic acid, succinic acid, glutaric acid, adipic acid, pimelic acid, maleic acid, phthalic acid, malic acid, tartaric acid, citric acid, lactic acid and the like. It is also possible to use an organic sulfonic acid such as methanesulfonic acid, ethanesulfonic acid and isethionic acid. An alkali metal salt of an inorganic acid or an organic acid may be used instead of the inorganic acid or the organic acid or in combination with the inorganic acid or the organic acid.

Specific examples of the amino acid may include glycine, α-alanine, β-alanine, N-methylglycine, N,N-dimethylglycine, 2-aminobutyric acid, norvaline, valine, leucine, norleucine, isoleucine, phenylalanine, proline, sarcosine, ornithine, lysine, taurine, serine, threonine, homoserine, tyrosine, bicine, tricine, 3,5-diiodo-tyrosine, β-(3,4-dihydroxyphenyl)-alanine, thyroxine, 4-hydroxy-proline, cysteine, methionine, ethionine, lanthionine, cystathionine, cystine, cysteic acid, aspartic acid, glutamic acid, S-(carboxymethyl)-cysteine, 4-aminobutyric acid, asparagine, glutamine, azaserine, arginine, canavanine, citrulline, δ-hydroxy-lysine, creatine, histidine, 1-methyl-histidine, 3-methyl-histidine, tryptophan and the like. Among them, glycine, alanine, malic acid, tartaric acid, citric acid, glycolic acid, isethionic acid or a salt thereof is preferable.

Specific examples of the nitrile compound may include acetonitrile, aminoacetonitrile, propionitrile, butyronitrile, isobutyronitrile, benzonitrile, glutarodinitrile, methoxyacetonitrile and the like.

Specific examples of the chelating agent may include nitrilotriacetic acid, diethylenetriaminepentaacetic acid, ethylenediaminetetraacetic acid, N,N,N-trimethylenephosphonic acid, ethylenediamine-N,N,N',N'-tetramethylenesulfonic acid, transcyclohexanediaminetetraacetic acid, 1,2-diaminopropanetetraacetic acid, glycoletherdiaminetetraacetic acid, ethylenediamineorthohydroxyphenylacetic acid, ethylenediaminedisuccinic acid (SS isomer), N-(2-carboxylate ethyl)-L-aspartic acid, β-alaninediacetic acid, 2-phosphonobutane-1,2,4-tricarboxylic acid, 1-hydroxyethylidene-1-diphosphonic acid, N,N'-bis(2-hydroxybenzyl)ethylenediamine-N,N'-diacetic acid, 1,2-dihydroxybenzene-4,6-disulfonic acid and the like.

The lower limit of the content of the complexing agent in the polishing composition is preferably 0.01% by mass or more and more preferably 0.1% by mass or more with respect to 100% by mass of the total amount of the composition. The polishing rate of the polishing object by the polishing composition is improved as the content of the complexing agent increases. On the other hand, the upper limit of the content of the complexing agent in the polishing composition is preferably 10% by mass or less, more preferably 5% by mass or less and particularly preferably 1% by mass or less with respect to 100% by mass of the total amount of the composition form the viewpoint of diminishing (to prevent excessive etching) the risk that the polishing object readily undergoes excessive etching by the addition of the complexing agents.

[Surfactant]

There is an advantage that dishing on the surface of the polishing object after being polished using the polishing composition is further diminished in addition to the fact that the hollow is less likely to be caused at the side of the wiring formed by polishing using the polishing composition by adding a surfactant to the polishing composition.

The surfactant used may be any of an anionic surfactant, a cationic surfactant, an amphoteric surfactant and a nonionic surfactant, but among them, an anionic surfactant and a nonionic surfactant are preferable. Several kinds of surfactants may be used in combination, and it is particularly preferable to use an anionic surfactant and a nonionic surfactant in combination.

It is preferable that specific examples of the anionic surfactant have a monooxyethylene group or a polyoxyethylene group. Specific examples of such an anionic surfactant may include a polyoxyethylene alkyl ether phosphoric acid, a polyoxyethylene alkyl ether acetic acid, and a polyoxyethylene alkyl ether sulfuric acid. In other words, it is possible to use the anionic surfactant which further has a phosphoric acid group, a carboxyl group or a sulfo group, and more specific examples thereof may include a polyoxyethylene alkyl ether acetic acid, a polyoxyethylene alkyl ether sulfuric acid, and alkyl ether sulfuric acid, a polyoxyethylene alkyl sulfate ester, and alkyl sulfate ester, polyoxyethylene alkyl sulfuric acid, and alkyl sulfuric acid, an alkyl benzene sulfonic acid, an alkyl phosphate ester, a polyoxyethylene alkyl phosphate ester, polyoxyethylene sulfosuccinic acid, and alkyl sulfosuccinic acid, and alkyl naphtalene sulfonic acid, an alkyl diphenyl ether disulfonic acid and a salt thereof. Among them, a polyoxyethylene alkyl ether acetic acid, a polyoxyethylene alkyl ether sulfate salt, an alkyl ether sulfate salt and an alkyl benzene sulfonate salt are preferable. Furthermore, from the viewpoint of improving the water repellency of the polishing object and lowering the affinity between the polishing composition and the polishing object, it is preferable that the anionic surfactant contained in the polishing composition have an alkyl group, more specifically, it is more preferable that the number of carbon atoms in the alkyl group be 8 or more, and specifically, an octyl sulfate salt, a decyl sulfate salt, a lauryl sulfate salt, an octadecyl sulfate salt, an octyl sulfonate salt, a decyl sulfonate salt, a lauryl sulfonate salt, an octadecyl sulfonate salt, an octyl acetate salt, a decyl acetate salt, a lauryl acetate salt, an octadecyl acetate salt, an octyl nitrate salt, a decyl nitrate salt, a lauryl nitrate salt and an octadecyl nitrate salt are more preferable. As these sulfate salts, sulfonate salts, acetate salts or nitrate salts, it is possible to exemplify a lithium salt, a sodium salt, a potassium salt, a magnesium salt and a calcium salt. In a case in which the anionic surfactant contained in the polishing composition has an alkyl group, the number of carbon atoms in the alkyl group is not particularly limited but is, for example, from 4 to 30, preferably from 6 to 26, more preferably from 8 to 22 and even more preferably from 10 to 18. These preferred anionic surfactants exhibit a high chemical or physical adsorption force to the surface of a polishing object and thus the water repellency of the polishing object is enhanced and a stronger protective membrane is formed on the surface of the polishing object. This is advantageous in terms of improving the flatness of the surface of the polishing object after being polished using the polishing composition.

Specific examples of the cationic surfactant may include an alkyl trimethyl ammonium salt, an alkyl dimethyl ammonium salt, an alkyl benzyl dimethyl ammonium salt and an alkyl amine salt.

Specific examples of the amphoteric surfactant may include an alkyl betaine and an alkyl amine oxide.

Specific examples of the nonionic surfactant may include a polyoxyalkylene alkyl ether such as a polyoxyethylene alkyl ether, a sorbitan fatty acid ester, a glycerin fatty acid ester, a polyoxyethylene fatty acid ester, a polyoxyethylene alkyl amine and an alkyl alkanolamide. Among them, a polyoxyalkylene alkyl ether is preferable. The polyoxyalkylene alkyl ether exhibits a high chemical or physical adsorption force to the surface of a polishing object and thus a stronger protective membrane is formed on the surface of the polishing object. This is advantageous in terms of improving the flatness of the surface of the polishing object after being polished using the polishing composition.

The content of the surfactant in the polishing composition is preferably at 0.001% by mass or more, more preferably 0.005% by mass or more and even more preferably is 0.01% by mass or more with respect to 100% by mass of the total amount of the composition. There is an advantage that the flatness of the surface of the polishing object after being polished using the polishing composition is improved as the content of the surfactant increase. The content of the surfactant in the polishing composition is also preferably 5.0% by mass or less, more preferably 2.5% by mass or less and even more preferably 1.0% by mass or less. There is an advantage that the polishing rate by the polishing composition is improved as the content of the surfactant decreases.

In the case of using the anionic surfactant as the surfactant, the content of the anionic surfactant is preferably from 0.001 to 5.0% by mass, more preferably from 0.005 to 2.5% by mass and even more preferably from 0.01 to 1.0% by mass with respect to 100% by mass of the total amount of the composition.

[Solid Surface Energy]

The solid surface energy of the polishing object surface after polishing the polishing object using the polishing composition according to the invention is 30 mN/m or less. Here, the solid surface energy is one of the indexes to evaluate the surface state of a solid, and the surface tension of a liquid to be in a state in which the liquid dropped on the solid surface does not form a droplet but wets the solid surface (the contact angle with the solid surface is 0°) is referred to as the solid surface energy of the solid. Specifically, a liquid having a known surface tension is dropped on a solid surface and the contact angle thereof (θ: theta) with the solid surface is measured immediately after dropping. Next, a graph exhibiting the linear relationship is obtained by plotting (Zisman's Plot) the surface tension of the various kinds of liquids on the horizontal axis (x-axis) and the cos θ thereof on the vertical axis (y-axis), and the surface tension when extrapolating θ to 0 (zero) is determined from the graph. The value, which can be determined by the extrapolation, of the surface tension when the contact angle (θ) is 0 (zero) is referred to as the solid surface energy of the solid.

The solid surface energy of the polishing object surface after polishing the polishing object using the polishing composition according to the invention is preferably 30 mN/m or less and more preferably 28 mN/m or less. The affinity between the polishing composition and the polishing object decreases as the solid surface energy decreases, and as a result, there is an advantage that the flatness of the surface of the polishing object after being polished using the polishing composition is improved. The lower limit of the solid surface energy of the polishing object surface after polishing the polishing object using the polishing composition according to the invention is not particularly limited but is preferably 2 mN/m of more and more preferably 10 mN/m or more. There is an advantage that the polishing rate by the polishing composition is improved on the solid surface energy increases.

The measurement of the solid surface energy of the surface of the polishing object after polishing according to the invention can be conducted, for example, for the following procedure. First, the polishing object is polished using the polishing composition. Next, a liquid of which the surface tension at 25° C. is known in dropped on the surface of the polishing object polished as described above in an environment having a temperature of 25° C. within 0.5 hour after polishing, and the contact angle of the droplet thus formed is measured using a commercially available contact angle meter. Specifically, the droplets of pure water (surface tension at 25° C.; 72.75 mN/m), glycerin (same; 63.7 mN/m), hexadecane (same; 27.5 mN/m) and the like are dropped on the surface of the polishing object by 5 µL for each and the contact angle thereof is measured at 5 seconds after dropping. The measured values obtained in this manner are plotted (Zisman's Plot) to create a graph, and the solid surface energy is calculated from the graph by extrapolating the contact angle to 0 (zero). Incidentally, examples of the commercially available contact angle meter to measure the contact angle of the droplet may include the contact angle meter "CA-DT" manufactured by Kyowa Interface Science Co., LTD, and the like. Incidentally, the adjustment of the solid surface energy of the surface of the polishing object after polishing according to the invention can be performed, for example, by the kind and content of the metal corrosion inhibitor or the surfactant which are described above, and it is possible to use an anionic surfactant having an alkyl group having 8 or more carbon atoms, for example.

[pH of Polishing Composition]

The pH of the polishing composition is not particularly limited. However, the handling of the polishing composition is facilitation when the pH is 10.0 or less and moreover 8.0 or less. In addition, the dispersibility of the abrasive grains is improved in a case in which the polishing composition contains abrasive grains when the pH is 4.0 or more and moreover 6.0 or more.

A pH adjusting agent may be used in order to adjust the pH of the polishing composition to a desired value. The pH adjusting agent to be used may be any of an acid or an alkali, or any of an inorganic or an organic compound. Sulfuric acid, nitric acid, phosphoric acid and the like are particularly preferable from the viewpoint of improving the polishing rate in the case of using an inorganic acid as the pH adjusting agent, and glycolic acid, succinic acid, maleic acid, citric acid, tartaric acid, malic acid, gluconic acid, itaconic acid and the like are preferable in the case of using an organic acid as the pH adjusting agent. Examples of the base usable as the pH adjusting agent may include an amino such as a aliphatic amine and an aromatic amino, an organic base such as quaternary ammonium hydroxide, an alkali metal hydroxide such as potassium hydroxide, an alkaline earth metal hydroxide, tetramethylammonium hydroxide, ammonia and the like. These pH adjusting agent can be used singly or as a mixture of two or more kinds.

[Water]

The polishing composition of the invention contains water as a dispersion medium or solvent for dispersing or dissolving each component. Water containing impurities as little as possible is preferable from the viewpoint of suppressing the inhibition of the impurities on the function of other components, and specifically, pure water, ultrapure water or distilled water from which the impurity ions are removed by an ion exchange resin and the foreign matters are removed through filtration is preferable.

[Other Components]

The polishing composition of the invention, if necessary, may further contain other components such as abrasive grains, a preservative, and antifungal agent, an oxidant, a reductant, a water-soluble polymer, an organic solvent for dissolving a sparingly soluble organic substance and the like. Hereinafter, the abrasive grains and the oxidant that are preferred other components will be explained.

[Abrasive Grains]

The abrasive grains contained in the polishing composition have a function of mechanically polishing a polishing object and improving the polishing rate of the polishing object by the polishing composition.

The abrasive grains used may be any of inorganic particles, organic particles and organic-inorganic composite particles. Specific examples of the inorganic particles may include particles composed of a metal oxide such as silica, alumina, ceria and titania, silicon nitride particles, silicon carbide particles and boron nitride particles. Specific examples of the organic particles may include polymethylmethacrylate (PMMA) particles. The abrasive grains may be used singly or as a mixture of two or more kinds. Moreover, the abrasive grains used may be a commercially available product or a synthetic product.

Among these abrasive grains, silica is preferable and colloidal silica is particularly preferable.

The abrasive grains may be surface-modified. The value of zeta potential of usual-colloidal silica is close to zero under an acidic condition and thus silica particles tend to aggregate without electrically repelling mutually under an acidic condition. In contrast, the abrasive grains which are surface modified so as to have a relatively great negative zeta potential value even under an acidic condition strongly repel mutually even under an acidic condition to be favorably dispersed, and as a result, the storage stability of the polishing composition is improved. Such surface-modified abrasive grains can be obtained, for example, by mixing a metal such as aluminum, titanium or zirconium or an oxide thereof with abrasive grains and doping on the surface of the abrasive grains.

Among them, colloidal silica having an organic acid immobilized is particularly preferable. The immobilization of an organic acid on the surface of colloidal silica to be contained in the polishing composition is performed, for example, by chemically bonding the functional group of the organic acid on the surface of colloidal silica. The immobilization of organic acid to colloidal silica cannot be accomplished by only allowing colloidal silica to simply coexist with an organic acid. It is possible to perform the immobilization, for example, by the method described in "Sulfonic acid-functionalized silica through quantitative oxidation of thiol groups", Chem. Commun., 245-247 (2003) when sulfonic acid of a kind of organic acids is immobilized colloidal silica. Specifically, it is possible to obtain colloidal silica. Specifically, it is possible to obtain colloidal silica having sulfonic acid immobilized on the surface by coupling a silane coupling agent having a thiol group such as 3-mercaptopropyltrimethoxysilane to colloidal silica and then oxidizing the thiol group with hydrogen peroxide. Alternatively, it is possible to perform the immobilization, for example, by the method described in "Novel Silane Coupling Agents Containing a Photolabile 2-Nitrobenzyl Ester for Introduction of a Carboxy Group on the surface of Silica Gel", Chemistry Letters, 3, 228-229 (2000) which carboxylic acid is immobilized on colloidal silica. Specifically, it is possible to obtain colloidal silica having carboxylic acid immobilized on the surface by coupling a silane coupling agent containing a photoreactive 2-nitrobenzyl ester to colloidal silica and then irradiating with light.

The lower limit of the average primary particle size of the abrasive grains is preferably 5 nm or more, more preferably 7 nm or more and even more preferably 10 nm or more. In addition, the upper limit of the average primary particle size of the abrasive grains is preferably 500 nm or less, more preferably 100 nm or less and even more preferably 70 nm or less. In such a range, the polishing rate of the polishing object by the polishing composition is improved and also it is possible to further suppress the occurrence of the step defect such as dishing on the surface of the polishing object after being polished using the polishing composition. Incidentally, the average primary particle size of the abrasive grains is calculated, for example, based on the specific surface area of the abrasive grains measured by the BET method.

In addition, the average secondary particle size of the abrasive grains is preferably 300 nm or less, more preferably 270 nm or less and even more preferably 250 nm or less. It is easy to obtain a polished surface having fewer scratches caused by polishing the polishing object using the polishing composition as the average secondary particle size of the abrasive grains decreases. The average secondary particle size of the abrasive grains can be measured, for example, by a laser light scattering method.

The average degree of association of the abrasive grains obtained by dividing the value of the average secondary particle size of the abrasive grains by the value of the average primary particle size is preferably 1.1 or more and more preferably 1, 3 or more. The abrasive grains having a high average degree of association has a cocoon shape or another irregular shape. The polishing rate of the polishing object is improved as the average degree of association of the abrasive grains is also preferably 5 or less, more preferably 4.5 or less and even more preferably 4 or less. It is easy to obtain a polished surface having fewer scratches caused by polishing the polishing object using the polishing composition as the average degree of association of the abrasive grains decreases.

The lower limit of the content of the abrasive grains in the polishing composition is preferably 0.006% by mass or more, more preferably 0.01% by mass or more, even more preferably 0.05% by mass or more and most preferably 0.1% by mass or more. In addition, the upper limit of the content of the abrasive grains in the polishing composition is preferably 50% by mass or less, more preferably 30% by mass of less and even more preferably 15% by mass or less. In such a range, the polishing rate of the polishing object is improved and also it is possible to cut down the cost of the polishing composition and to further suppress the occurrence of the step defect such as dishing on the surface of the polishing object after being polished using the polishing composition.

[Oxidant]

The polishing composition according to the present embodiment may contain an oxidant as an arbitrary component. The oxidant in the present specification means a compound which can function as an oxidant for the metal contained in the polishing object. Hence, the oxidant can be selected according to the criteria whether a compound has an oxidation reduction potential enough to exert such a function or not. For that reason, the extension of the nonmetallic oxidant is not necessarily definitively clearly determined, but examples thereof may include hydrogen peroxide, nitric acid, chlorous acid, hypochlorous acid, periodic acid, a persulfate salt, hydrogen oxide and an adduct thereof, urea hydrogen peroxide for example, peroxycarbonate, peroxy dicarbonate, an organic peroxide, benzoyl peroxide, peracetic acid, di-t-butyl peroxide, peroxomonosulfate ($H_2SO_3$), peroxide sulfate ($H_2S_2O_8$) and sodium peroxide. In addition, other examples of the oxidant may include periodic acid, iodous acid, hypoiodic acid, iodic acid, perbromic acid, bromous acid, hypobromic acid, bromic acid, perchloric acid, chloric acid, perchloric acid, perboric acid and salts of the respective acids.

In a case in which the polishing composition according to this embodiment contains an oxidant, the lower limit of the content of the oxidant in the polishing composition is preferably 0.1% by mass or more and more preferably 0.3% by mass or more with respect to 100% by mass of the total amount of the composition. The polishing rate of the polishing object by the polishing composition tends to be improved as the content of the oxidant increases. On the other hand, in a case in which the polishing composition according to this embodiment contains an oxidant, the upper limit of the content of the oxidant in the polishing composition is preferably 10% by mass or less and more preferably 5% by mass or less with respect to 100% by mass of the total amount of the composition. It is possible to reduce the bother of disposing the polishing composition after using for polishing, namely the waste disposal in addition to the fact that the material cost of the polishing composition can be cut down as the content of the oxidant decreases. There is also obtained an advantageous effect to prevent the polishing object from being excessively oxidized by the oxidant.

[Method for Producing Polishing Composition]

The method for producing a polishing composition of the invention is not particularly limited, and for example, the polishing composition can be obtained by mixing a metal corrosion inhibitor, a complexing agent, a surfactant and other components if necessary in water through stirring.

The temperature when mixing the respective components is not particularly limited but is preferably from 10 to 4° C., and heating may be performed in order to increase the dissolution rate. In addition, the mixing time is not also particularly limited.

[Polishing Method and Method for Producing Substrate]

As described above, the polishing composition of the invention is suitably used ins the polish of a polishing object having a metal wiring layer. Hence, the invention provides a polishing method to polish a polishing object having a metal wiring layer with the polishing composition of the invention. In addition, the invention also provides a method for producing a substrate including a step of polishing a polishing object having a metal wiring layer by the polishing method.

As the polishing apparatus, it is possible to use a general polishing apparatus which is equipped with a holder to hold a substrate having a polishing object and the like, a motor capable of charging the rotation number and the like and has a polishing table capable of being attached with a polishing pad (polishing cloth).

As the polishing pad, it is possible to use a general nonwoven fabric, polyurethane and a porous fluorine resin without particular limitation. The polishing pad is preferably subjected to a grooving process so as to hold the polishing liquid.

The polishing condition is not also particularly limited, and for example, the rotational speed of the polishing table is preferably from 10 to 500 rpm and the pressure applied to the substrate having the polishing object (polishing pressure) is preferably from 0.5 to 10 psi. The method for supplying the polishing composition to the polishing pad is not also particularly limited, and for example, a method of continuously supplying by a pump (constant flow usage) of the like is employed. There is no limitation on the supply amount, but it is preferable that the surface of the polishing pad be always covered with the polishing composition of the invention.

After the polishing is completed, the substrate is washed with running water and the water droplets attached on the substrate are shaken off and dried by a spin dryer or the like, thereby obtaining a substrate having a metal wiring layer and a barrier layer. The substrate produced by the invention is not particularly limited as long as it is a substrate used in the manufacture of a semiconductor integrated circuit, and examples thereof may include a metal substrate or a silicon substrate.

The invention will be described in more detail with reference to the following Examples and Comparative Examples. However, the technical scope of the invention is not limited to only the following Examples.

Examples 1 to 3 and Comparative Examples 1 and 2

The polishing compositions of Examples 1 to 3 and Comparative Examples 1 and 2 were prepared by mixing (mixing temperature: about 25° C. and mixing time: 10 minutes) the anionic surfactant (a compound for adjusting the solid surface energy of the surface of the polishing object after polishing, the column of "compound" in Table), the complexing agent, the oxidant, the metal corrosion inhibitor, the nonionic surfactant and the abrasive grains which were presented in Table 2 in water through stirring. At this time, colloidal silica (content with respect to 100% by mass of the total amount of the composition 0.1% by mass) having an average secondary particle size of about 70 nm (average primary particle size: 35 nm and the degree of association: 2) was used as the abrasive grains. As the metal corrosion inhibitor, 1H-benzotriazole (content with respect to 100% by mass of the total amount of the composition: 0.03% by mass) was used. Polyoxyethylene alkyl ether (content with respect to 100% by mass of the total amount of the composition: 0.06% by mass) was used as the nonionic surfactant. Hydrogen peroxide (content with respect to 100% by mass of the total amount of the composition: 1% by mass) was used as the oxidant. Glycine (content with respect to 100% by means of the total amount of the composition: 1% by mass) was used as the complexing agent. The pH of the composition was adjusted by adding potassium hydroxide (KOH) and confirmed by a pH meter.

Incidentally, in the column of "compound" presented in Table 2, the notation " . . . " indicates that the compound is not contained. Each "compound" in Table 2 has the content that is expressed with respect to 100% by mass of the total amount of the composition and presented in Table 2.

With regard to the polishing rate, the polishing rate was measured when the surface of the copper blanket wafer was polished for 60 seconds using the polishing composition that obtained under the polishing condition presented in the following Table 1. The polishing rate was determined by dividing the difference in thickness of the copper blanket wafer before and after polishing measured using a sheet resistance measuring device of which the principle was a four-probe DC method by the polishing time.

In addition, the measurement of the solid surface energy of the surface of the polishing object after polishing was conducted by the following procedure. First, the surface of the copper blanket water was polished for 60 seconds using the polishing composition thus obtained under the polishing condition presented in the following Table 1. Next, a liquid of which the surface tension at 25° C. was known was dropped on the surface of the polishing object after polishing in an environment having a temperature of 25° C., and the contact angle of the droplet thus formed was measured using a commercially available contact angle meter ("CA-DT") manufactured by Kyowa Interface Science Co., LTD.). Incidentally, pure water (surface tension at 24° C.; 72.75 mN/m), glycerin (same; 63.7 mN/m) and hexadecane (same; 27.5 mN/m) were used as the known liquids, the droplets thereof were dropped on the surface of the polishing object by 5 µL for each and the contact angle thereof was measured in 5 seconds after dropping using the commercially available contact angle meter. The measured values thus obtained were plotted (Zisman Plot) to create a graph, and the solid surface energy was calculated from the graph by extrapolating the contact angle to 0) zero.

In addition, with regard to dishing as the step defect, the surface of the copper pattern wafer (copper membrane thickness: 70 nm and trench depth: 300 nm before polishing) was polished using the polishing composition thus obtained under the first polishing condition presented in the following Table 1 until the left copper membrane had a thickness of 200 nm. Thereafter, the surface of the copper pattern wafer after polishing was polished using the name polishing composition under the second polishing condition presented in the following Table 1 until the barrier layer was exposed. The dishing quantity (dishing depth) of the copper pattern wafer after being subjected to the two-step polishing in this manner was measured in the first region in which the wiring having a width of 9 µm and the insulating membrane having a width of 1 µm were alternately lined up and the second region in which the wiring having a width of 0.25 µm and the insulating membrane having a width of 0.25 µm were alternately lined up using an atomic force microscope. The dishing quantity to be measured is in a practical level when the value of the first region is 70 nm or less and the value of the second region is 10 nm or less.

TABLE 1

<First polishing condition>

Polishing device: single sided CMP polishing device
Polishing pad: polyurethane foam pad
Polishing pressure: 3.0 psi
Rotation number of table: 90 rpm
Supply of polishing composition: constant flow usage
Rotation number of carrier: 84 rpm
<Second polishing condition>

Polishing device: single sided CMP polishing device
Polishing pad: polyurethane foam pad
Polishing pressure: 1 psi
Rotation number of table: 70 rpm
Supply of polishing composition: constant flow usage
Rotation number of carrier: 64 rpm The measurement results of the polishing rate, the solid surface energy after polishing and dishing are presented in the following Table 2.

TABLE 2

| | Compound | | pH of composition | Contact angle (degree) | cos θ | Approximate equation | Solid surface energy (mN/m) y = 1 | Evaluation Dishing (nm) | | Polishing rate (Å/min) |
|---|---|---|---|---|---|---|---|---|---|---|
| | Kind | Concentration | | | | | | First region | Second region | |
| Example 1 | Sodium octyl sulfate | 2 mM (0.05% by mass) | 7.3 | 50 40 15 | 0.643 0.766 0.966 | y = −0.0067 x +1.1566 | 23.37 | 51 | 3 | 3500 |
| Example 2 | Sodium lauryl sulfate | 2.0 mM (0.06% by mass) | 7.3 | 93 70 18 | −0.052 0.342 0.951 | y = −0.0206 x +1.5419 | 26.31 | 33 | 2 | 3000 |
| Example 3 | Sodium octadecyl sulfate | 1.8 mM (0.07% by mass) | 7.3 | 110 88 27 | −0.342 0.035 0.891 | y = −0.0262 x +1.6276 | 23.95 | 30 | 2 | 3200 |
| Comparative Example 1 | None | — | — | 50 29 3 | 0.643 0.875 0.999 | y = −0.0066 x +1.1991 | 30.17 | 150 | 50 | 3300 |
| Comparative Example 2 | Sodium propyl sulfate | 5 mM (0.08% by mass) | 7.3 | 50 20 4 | 0.642 0.875 0.999 | Y = −0.0061 x +1.191 | 31.31 | 100 | 8 | 3200 |

In Table, in the column of "contact angle", the upper row represents the contact angle of water, the middle row glycerin and the lower row hexadecane, respectively. In Table, in the column of "cos θ", the upper row represents the value obtained by converting the contact angle of water to cos θ, the middle row glycerin and the lower row hexadecane, respectively. In Table, the column of "approximate equation" represents the equation of the graph which exhibits the linear relationship and is obtained by plotting (Zisman Plot) the contact angle on the horizontal axis (x-axis) and the cos θ thereof on the vertical axis (y-axis). In Table, the column of "solid surface energy" represents the value obtained when extrapolating θ to 0 (zero), that is cos θ=1 as the solid surface energy.

As presented in Table 2, it has been acknowledged that a significantly superior effect is exhibited in dishing and the polishing rate in the case of using the polishing compositions of Examples 1 to 3 as compared to the case of using the polishing compositions of Comparative Examples 1 and 2 which do not satisfy the conditions of the invention.

Incidentally, this application is based upon the prior Japanese Patent Application No. 2012-243126, filed on Nov. 2, 2012, the entire contents of which are incorporated herein by reference.

The invention claimed is:

1. A polishing composition used in polishing a polishing object having a metal wiring layer, the polishing composition consisting essentially of:
a metal corrosion inhibitor;
a complexing agent;
a surfactant;
water,
abrasive grains,
a pH adjusting agent, and
an oxidant, wherein the pH of the polishing composition is 6.0 or more and 10.0 or less, and
solid surface energy of the polishing object surface after polishing the polishing object using the polishing composition is 30 mN/m or less,
the abrasive grains are selected from the group consisting of silica particles, alumina particles, ceria particles, titania particles, silicon nitride particles, silicon carbide particles, boron nitride particles, and polymethylmethacrylate (PMMA) particles, which may be surface-modified,
the metal corrosion inhibitor is selected from the group consisting of 1H-pyrazole, 4-nitro-3-pyrazole carboxylic acid, 3,5-pyrazole carboxylic acid, 3-amino-5-phenyl pyrazole, 5-amino-3-phenyl-pyrazole, 3-aminopyrazole, 3,5-dimethylpyrazole, 3,5-dimethyl-1-hydroxymethyl pyrazole, 3-methylpyrazole, 1-methylpyrazole, 3-amino-5-methylpyrazole, 4-amino-pyrazolo[3,4-d]pyrimidine, allopurinol, 3,4-dihydroxy-6-methylpyrazolo(3,4-B)-pyridine, 6-methyl-1H-pyrazolo[3,4-b]pyridin-3-amine, imidazole, 1-methylimidazole, 2-methylimidazole, 4-methylimidazole, 1,2-dimethylpyrazole, 2-ethyl-4-methylimidazole, 2-isopropylimidazole, benzimidazole, 5,6-dimethylbenzimidazole, 2-amino-benzimidazole, 2-methylbenzimidazole, 2-(1-hydroxyethyl)benzimidazole, 2-hydroxy-benzimidazole, 2-phenylbenzimidazole, 2,5-dimethylbenzimidazole, 5-methylbenzimidazole, 5-nitrobenzimidazole 1H-purine, 1,2,3-triazole 1,2,4-triazole 1-methyl-1,2,4-triazole, methyl-1H-1,2,4-triazole-3-carboxylate, 1,2,4-triazole-3-carboxylic acid, methyl 1,2,4-triazole-3-carboxylate, 1H-1,2,4-triazole-3-thiol, 3,5-diamino-1H-1,2,4-triazole, 3-amino-1,2,4-triazole-5-thiol, 3-amino-1H-1,2,4-triazole, 3-amino-5-benzyl-4H-1,2,4-triazole, 3-amino-5-methyl-4H-1,2,4-triazole, 3-nitro-1,2,4-triazole, 4-(1,2,4-triazol-1-yl)phenol, 4-amino-1,2,4-triazole, 4-amino-3,5-dipropyl-4H-1,2,4-triazole, 4-amino-3,5-dimethyl-4H-1,2,4-triazole, 4-amino-3,5-dipeptyl-4H-1,2,4-triazole, 5-methyl-1,2,4-triazole-3,4-diamine, 1H-benzotriazole, 1-hydroxybenzotriazole, 1-aminobenzotriazole, 1-carboxybenzotriazole, 5-nitro-1H-benzotriazole, 5-carboxy-1H-benzotriazole, 5-methyl-1H-benzotriazole, 5,6-dimethyl-1H-benzotriazole, 1-(1',2'-dicarboxyethyl)benzotriazole, 1-[N,N-bis(hydroxyethyl)aminomethyl]benzotriazole, 1-[N,N-bis(hydroxyethyl)aminomethyl]-5-methylbenzotriazole, 1-[N,N-bis(hydroxyethyl)aminomethyl]-4-methylbenzotriazole, 1H-tetrazole, 5-methyltetrazole, 5-aminotetrazole and 5-phenyltetrazole, 1H-indazole, 5-amino-1H-indazole, 5-nitro-1H-indazole, 5-hydroxy-1H-indazole, 6-amino-1H-indazole, 6-nitro-1H-indazole, 6-hydroxy-1H-indazole, 3-carboxy-5-methyl-1H-indazole, 1H-indole, 1-methyl-1H-indole, 2-methyl-1H-indole, 3-methyl-1H-indole, 4-methyl-1H-indole, 5-methyl-1H-indole, 6-methyl-1H-indole, 7-methyl-1H-indole, 4-amino-1H-indole, 5-amino-1H-indole, 6-amino-1H-indole, 7-amino-1H-indole, 4-hydroxy-1H-indole, 5-hydroxy-1H-indole, 6-hydroxy-1H-indole, 7-hydroxy-1H-indole, 4-methoxy-1H-indole, 5-methoxy-1H-indole, 6-methoxy-1H-indole, 7-methoxy-1H-indole, 4-carboxy-1H-indole, 5-carboxy-1H-indole, 6-carboxy-1H-indole, 7-carboxy-1H-indole, 4-nitro-1H-indole, 5-nitro-1H-indole, 6-nitro-1H-indole, 7-nitro-1H-indole, 4-nitrile-1H-indole, 5-nitrile-1H-indole, 6-nitrile-1H-indole, 7-nitrile-1H-indole, 2,5-dimethyl-1H-indole, 1,2-dimethyl-1H-indole, 1,3-dimethyl-1H-indole, 2,3-dimethyl-1H-indole, 5-amino-2,3-dimethyl-1H-indole, 7-ethyl-1H-indole, 5-(aminomethyl)indole, 2-methyl-5-amino-1H-indole, 3-hydroxymethyl-1H-indole, and 6-isopropyl-1H-indole, the complexing agent is selected from the group consisting of sulfuric acid, nitric acid, boric acid, formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, methanesulfonic acid, ethanesulfonic acid, isethionic acid, glycine, α-alanine, β-alanine, N-methylglycine, N,N-dimethylglycine, 2-aminobutyric acid, norvaline, valine, leucine, norleucine, isoleucine, phenylalanine, proline, sarcosine, ornithine, lysine, taurine, serine, threonine, homoserine, tyrosine, bicine, tricine, β-(3,4-dihydroxyphenyl)-alanine, thyroxine, 4-hydroxy-proline, cysteine, methionine, ethionine, lanthionine, cystathionine, cystine, cysteic acid, aspartic acid, glutamic acid, S-(carboxymethyl)-cysteine, 4-aminobutyric acid, asparagine, glutamine, azaserine, arginine, canavanine, citrulline, δ-hydroxy-lysine, creatine, histidine, 1-methyl-histidine, 3-methyl-histidine, tryptophan, acetonitrile, aminoacetonitrile, propionitrile, butyronitrile, isobutyronitrile, benzonitrile, glutarodinitrile, methoxyacetonitrile, nitrilotriacetic acid, diethylenetriaminepentaacetic acid, ethylenediaminetetraacetic acid, N,N,N-trimethylenephosphonic acid, ethylenediamine-N,N,N',N'-tetramethylenesulfonic acid, transcyclohexanediaminetetraacetic acid, 1,2-diaminopropanetetraacetic acid, glycoletherdiaminetetraacetic acid, ethylenediamineorthohydroxyphenylacetic acid, ethylenediaminedisuccinic acid (SS isomer), N-(2-carboxylate ethyl)-L-aspartic acid, β-alaninediacetic acid, 2-phosphonobutane-1,2,4-tricarboxylic acid, 1-hydroxyethylidene-1,1-diphosphonic acid, N,N'-bis(2-hydroxybenzyl)ethylenediamine-N,N'-diacetic acid, and 1,2-dihydroxybenzene-4,6-disulfonic acid, the surfactant is an anionic surfactant selected from the group consisting of polyoxyethylene alkyl ether acetic acid, a polyoxyethylene alkyl ether sulfuric acid, an alkyl ether sulfuric acid, a polyoxyethylene alkyl sulfate ester, an alkyl sulfate ester, polyoxyethylene alkyl sulfuric acid, an alkyl sulfuric acid, an alkyl benzene sulfonic acid, an alkyl phosphate ester, a polyoxyethylene alkyl phosphate ester, polyoxyethylene sulfosuccinic acid, an alkyl sulfosuccinic acid, an alkyl naphthalene sulfonic acid, an alkyl diphenyl ether disulfonic acid and a salt thereof; in combination with a nonionic surfactant selected from the group consisting of polyoxyethylene alkyl ether, a sorbitan fatty acid ester, a glycerin fatty acid ester, a polyoxyethylene fatty acid ester, a polyoxyethylene alkyl amine and an alkyl alkanolamide, the pH adjusting agent is selected from the group consisting of sulfuric acid, nitric acid, phosphoric acid, glycolic acid, succinic acid, maleic acid, citric acid, tartaric acid, malic acid, gluconic acid, itaconic acid, aliphatic amine, an aromatic amine, quaternary ammonium hydroxide, an alkali metal hydroxide, an alkaline earth metal hydroxide, tetramethylammonium hydroxide, and ammonia, the oxidant is selected from the group consisting of hydrogen peroxide, nitric acid, a persulfate salt, hydrogen oxide, urea hydrogen peroxide, peroxycarbonate, peroxydicarbonate, benzoyl peroxide, peracetic acid, di-t-butyl peroxide, peroxomonosulfate ($H_2SO_5$), peroxodisulfate ($H_2S_2O_8$), and sodium peroxide.

2. The polishing composition according to claim 1, wherein the anionic surfactant has an alkyl group having 8 or more carbon atoms.

3. The polishing composition according to claim 1, further comprising abrasive grains.

4. A polishing method to polish a polishing object having a metal wiring layer using the polishing composition according to claim 1.

5. A method for producing a substrate, comprising:
a step of polishing a polishing object having a metal wiring layer by the polishing method according to claim 4.

* * * * *